United States Patent
Propp et al.

(10) Patent No.: US 7,398,451 B2
(45) Date of Patent: Jul. 8, 2008

(54) ERROR CORRECTION PROCESS AND MECHANISM

(75) Inventors: Michael B. Propp, Brookline, MA (US); John Jakson, Marlborough, MA (US)

(73) Assignee: Adaptive Networks, Inc., Newton, MA (US)

(*) Notice: Subject to any disclaimer, the term of this patent is extended or adjusted under 35 U.S.C. 154(b) by 483 days.

(21) Appl. No.: 10/486,248

(22) PCT Filed: Aug. 9, 2002

(86) PCT No.: PCT/US02/25139

§ 371 (c)(1),
(2), (4) Date: Dec. 30, 2004

(87) PCT Pub. No.: WO03/015285

PCT Pub. Date: Feb. 20, 2003

(65) Prior Publication Data

US 2005/0097429 A1    May 5, 2005

Related U.S. Application Data

(60) Provisional application No. 60/310,824, filed on Aug. 9, 2001.

(51) Int. Cl.
*H03M 13/00* (2006.01)

(52) U.S. Cl. .................... 714/774; 714/779; 714/780
(58) Field of Classification Search ................ 714/774, 714/779, 780
See application file for complete search history.

(56) References Cited

U.S. PATENT DOCUMENTS

| | | | | |
|---|---|---|---|---|
| 4,653,051 A | * | 3/1987 | Sugimura et al. | 714/755 |
| 4,653,052 A | * | 3/1987 | Doi et al. | 714/755 |
| 5,615,221 A | * | 3/1997 | Karp et al. | 714/752 |
| 5,631,909 A | * | 5/1997 | Weng et al. | 714/704 |
| 5,715,236 A | | 2/1998 | Gilhousen et al. | |
| 5,838,267 A | | 11/1998 | Wang et al. | |
| 5,870,405 A | | 2/1999 | Hardwick et al. | |
| 5,944,842 A | | 8/1999 | Propp et al. | |
| 5,968,199 A | * | 10/1999 | Khayrallah et al. | 714/783 |
| 6,108,811 A | * | 8/2000 | Nakamura et al. | 714/795 |
| 6,199,189 B1 | | 3/2001 | Classon | |

* cited by examiner

*Primary Examiner*—Joseph D Torres
(74) *Attorney, Agent, or Firm*—Fish & Richardson P.C.

(57) ABSTRACT

Performing soft error correction includes receiving a word at a soft correction engine capable of operating in more than one correction mode, identifying soft bit positions within the word, and automatically generating a number of possible results for the received word using combinations of the soft bit positions and the more than one correction modes. The soft correction engine may include a Golay engine.

22 Claims, 8 Drawing Sheets

ERROR CORRECTION PROCESS AND MECHANISM

CROSS REFERENCE TO RELATED APPLICATIONS

This application claims priority from U.S. Provisional Application No. 60/310,824, filed Aug. 9, 2001, and titled "Error Correction Process and Mechanism," which is incorporated by reference.

TECHNICAL FIELD

This disclosure relates to an error correction process and mechanism.

BACKGROUND

In a data communication system, it is important to have reliable data transmission over a transmission medium. There are numerous factors that may affect the reliability and integrity of the data transmitted. For example, the reliability and integrity of the data transmitted may be affected by the transmitting system, the transmission medium, and/or the receiving system.

SUMMARY

In one general aspect, performing soft error correction includes receiving a word at a soft correction engine capable of operating in more than one correction mode, identifying soft bit positions within the word, and automatically generating a number of possible results for the received word using combinations of the soft bit positions and the more than one correction modes.

Implementations may include one or more of the following features. For example, the several possible results may include default results and alternate results. Within the several possible results, possible correct solutions may be selected from among at least one of the default results and alternate results based on a metric representing a likelihood of correctness. The metric may include a lowest partial correction count value.

At least one result from among the number of possible results may be inputted into an error handling engine for error detection. The error handling engine may include a cyclic redundancy check (CRC) engine.

In one implementation, from among the several possible results, a default result and an alternate result may be inputted into an error handling engine for selection of a correct solution as between the default result and the alternate result. The error handling engine may include a CRC engine. The default result and the alternate result that differs from the default result by one or more words may be inputted into the error handling engine for selection of the correct solution as between the default result and the alternate result. The soft correction engine may include a Golay engine.

In another implementation, the word may be received at a second correction engine that is capable of operating in more than one correction mode and that is structured and arranged to operate in parallel with the first correction engine. Soft error correction may be performed, in parallel, on the received word at both the first soft correction engine and the second soft correction engine. Both the first soft correction engine and the second correction engine may automatically generate a number of possible results for the received word. The first soft correction engine and the second soft correction engine may include a Golay engine.

In another general aspect, performing error correction includes performing, at a soft error correction engine, soft error correction on a stream of bits and producing at least one result with a default and an alternative and selecting, at an error handling engine, among the default and the alternative for the result produced by the soft error correction engine.

Implementations may include one or more of the following features. For example, the soft error correction engine may include a Golay engine. The error handling engine may include a CRC engine. The soft error correction engine and the error handling engine may be structured and arranged to operate in series. The alternative may differ from the default by one or more words and the error handling engine may select among the default and the alternative for the result produced by the soft error correction engine.

In another general aspect, error detection and correction includes receiving a default word and an alternate word at an error handling engine, calculating a first remainder for the default word and a second remainder for the alternate word, selecting the default word as a correct result when the first remainder matches a transmitted remainder, and selecting the alternate word as the correct result when the second remainder matches the transmitted remainder.

Implementations may include one or more of the following features. For example, the error handling engine may include a CRC engine. The default word and the alternate word may be received from a soft error correction engine. Soft error correction may be performed at the soft error correction engine to produce the default word and the alternate word and the default word and the alternate word may be sent to the error handling engine. The soft error correction engine may include a Golay engine.

In another general aspect, performing soft error correction includes receiving a multiple bit word at both a first soft correction engine and a second soft correction engine that are structured and arranged to operate in parallel. Soft error correction is performed in parallel on the received multiple bit word at both the first soft correction engine and the second soft correction engine. A first correction result is outputted at the first soft correction engine and a second correction result is outputted at the second soft correction engine.

Implementations may include one or more of the following features. For example, soft error correction may be performed in parallel on the received multiple bit word at both the first soft correction engine and the second soft correction engine concurrently. A first correction value may be generated at the first soft correction engine and a second correction value may be generated at the second soft correction engine such that selecting among the first correction result and the second correction result may be based on a lower value between the first correction value and the second correction value. The first and second soft correction engines each may include a Golay engine.

In another general aspect, performing soft error correction includes receiving a word at a soft correction engine, selecting a soft bit position other than a bit with a lowest correlation value, and evaluating the selected bit for soft error correction.

Implementations may include one or more of the following features. For example, the soft correction engine may include a Golay engine. A bit for soft error correction may be selected based on the evaluation and soft error correction may be performed on the selected bit.

These general and specific aspects may be implemented using a system, a method, or a computer program, or any combination of systems, methods, or computer programs.

DESCRIPTION OF DRAWINGS

Like reference symbols in the various drawings may indicate like elements.

DETAILED DESCRIPTION

Figure 1:
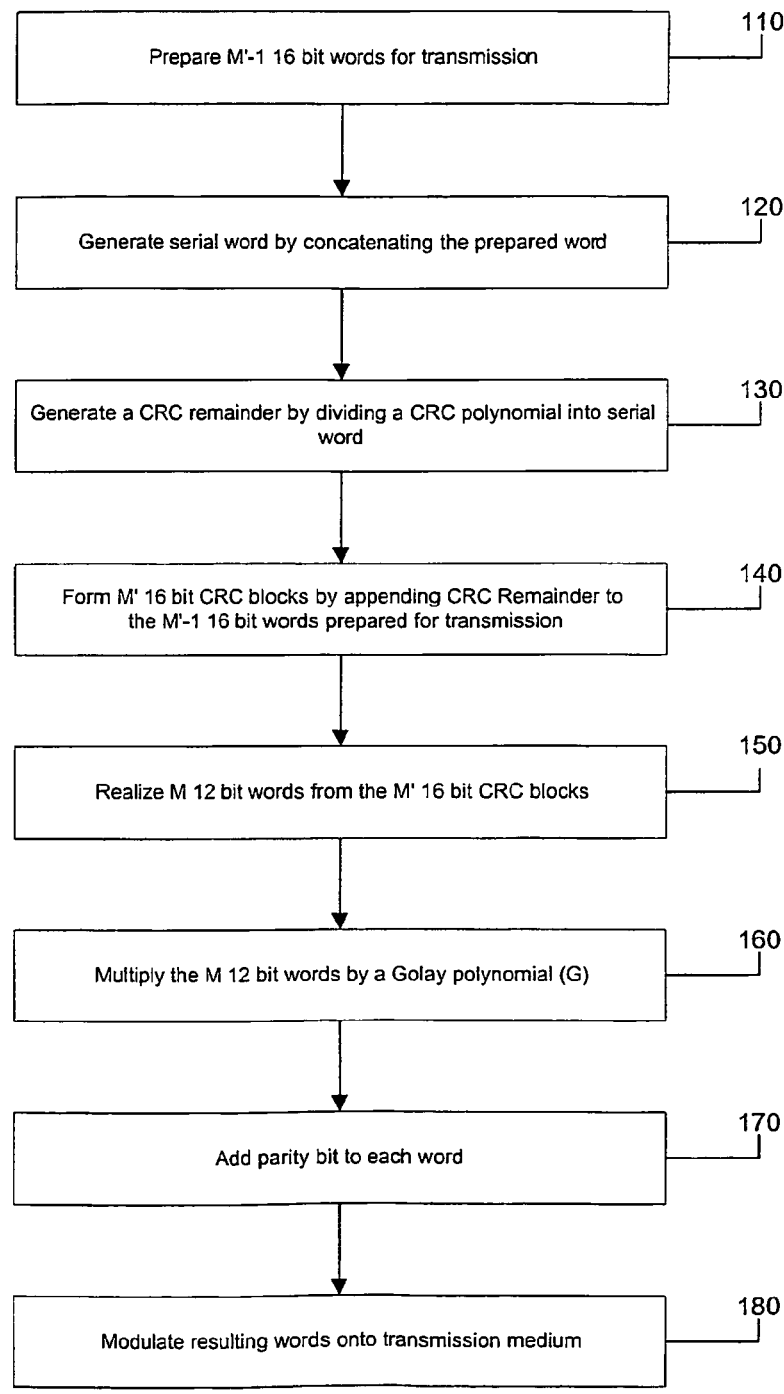
FIG. 1 is a flow chart of an exemplary encoding and transmission process.

An error correction mechanism may include several layers of correction. For instance, an error correction may be based on the combination of two layers of error correction that include an (n, k) error correction using soft bits and an error handling engine (e.g., an error detection and/or error correction process). The error handling engine may include an error detection engine and/or an error correction engine, such as, for example, a Cyclic Redundancy Check (CRC) engine.

In one implementation, for example, the first layer includes Golay correction (e.g., a Golay engine) and the second layer includes CRC error block detection and correction (e.g., a CRC error block detection engine). In a more specific implementation that will provide the basis for further description, but which should not be read to limit the application of the general principles to other implementations, the error correction mechanism may combine a (24,12) Golay code with a 16-bit CRC.

The first engine, the Golay engine in this example, generally includes a detection and correction code ("Golay code") that may be capable of detecting and correcting up to three randomly positioned errors per 23-bit word. The Golay code is generally a 12- to 23-bit code, which may be augmented with a parity bit as described below to enable support of soft error correction. Specifically, an augmented Golay may be obtained by adding one parity bit to a 23-bit Golay word in order to form a 24-bit augmented Golay word.

The augmented Golay code has the capability of correcting up to four errors per word if one or more faulty bit positions can be accurately predicted. More precisely, when a faulty bit position is predicted accurately, the Golay correction engine may correct the corresponding error bit known as a "soft" error due to the predictable position and three other error bits, whether or not the positions of those three other bits are also predictable. When the positions of these error bits are unpredictable, they generally are referred to as "hard" errors.

Additionally, using the augmented Golay, it is possible to change the ratio of hard to soft errors being corrected. For instance, it is possible to trade one hard error for two soft errors, two hard errors for four soft errors, or three hard errors for six soft errors. For example: a 3_1 Golay correction mode means that the Golay correction mode is set to correct three hard errors and one soft error; a 2_3 Golay correction mode means that the Golay correction mode is set to correct two hard errors and three soft errors; a 1_5 Golay correction mode means that the Golay correction mode is set to correct one hard error and five soft errors; and a 0_7 Golay correction mode means that the Golay correction mode is set to correct zero hard errors and seven soft errors. However, as the number of soft errors to be corrected increases, so too does the number of error bits to be predicted. In the hardware implementation for a 3_1 Golay correction mode, the correction ability is equal to the simpler 3-bit hard Golay correction if the faulty bit position is unpredictable, but improved if the faulty bit position has been or can be predicted correctly. By contrast, for the other three correction modes identified above (2_3, 15, and 0_7), the correction ability of the Golay code could be worse than the simple 3-bit hard Golay correction absent an accurate prediction of at least one, two, or three soft bit positions, respectively.

The soft bits may be identified using various prediction methodologies. For instance, it is possible to identify bits that have the lowest correlation values with respect to the transmitted waveform because those bits are likely to contain more errors than bits having a higher correlation value with respect to the transmitted waveform. U.S. Pat. No. 5,872,791 describes one implementation of soft and hard error correction for a Golay-coded word. In that patent, the bits with the lowest weights (i.e., lowest correlation values) generally are flagged for soft correction. However, as these identification schemes are used to merely predict rather than affirmatively identify the location of erroneous bits, they may not be completely reliable and may sometimes lead to the misidentification of error bit positions.

In avoiding and compensating for possible misidentification of error position, this error correction mechanism may be modified such that the soft bit selection includes consideration of bits other than the bit with the lowest weight. For instance, in addition to the bit with the lowest bit weight, consideration may be given to the bit with the second lowest bit weight, the bit with the third lowest bit weight, and/or various bits up to and including the bit with the lowest bit weight. The selection of which and how many bits will be considered may be preconceived or determined on the fly using an algorithm, or through operator selection, or by virtue of hardware limitations or capabilities since consideration of additional bits generally requires more permutations of the computation and hence an increased hardware demand.

As generally described above and as illustrated through the example provided below, the first error correction engine (e.g., the Golay engine) typically uses the soft error capabilities to generate not one, but several possible solutions for each input Golay word. Where the number of bits identified as candidates for soft correction is five (N=5), the theoretical maximum number of suitable solutions for each Golay word could be sixteen solutions partitioned as follow:

$$\binom{N}{1} = 5 \text{ solutions for the 3\_1 mode,}$$

$$\binom{N}{3} = 10 \text{ solutions for the 2\_3 mode,}$$

$$\binom{N}{5} = 1 \text{ solutions for the 1\_5 mode, and}$$

$$\binom{N}{7} = 0 \text{ solutions for the 0\_7 mode.}$$

Some or all of the solutions may be stored, and the stored solutions may be ranked based on criteria indicative of their likely accuracy, for example, a partial correction count value indicating the number of corrections made to a word by the first engine.

The second engine, the CRC block detection engine in the example, may be added for error detection in evaluating blocks of M Golay words (hereinafter "CRC blocks"). Whether one or more solutions are received for a particular word in a CRC block or whether one or more entire blocks are received, the second engine will identify and flag for retransmission or correction blocks that do not pass the CRC test. Furthermore, when more than one solution for a particular word is passed to the second engine, CRC block detection may be used to select a preferred or optimal solution (e.g., a preferred solution among solutions having a CRC syndrome equal to "0"). If no acceptable CRC solution is found, the block may flagged as faulty (for retransmission or correction).

As generally described above and more specifically described below, the error correction mechanism includes using the soft bit correction capability of a (n, k) error correction mechanism and various aspects of CRC error detection and correction in novel ways. For instance, the error correction mechanism may include several features, namely:

Relaxing the soft bit position selection. Indeed, instead of constraining the soft bit position to a single position, namely the bit with the lowest correlation value with the transmitted waveform, bits more than generally having lowest correlation values may be selected and evaluated as possible candidates for soft correction.

Automatically performing multiple runs using combinations of soft bit positions and combinations of correction modes (3_1, 2_3, 1_5, and 0_7).

Using the detection capabilities of the CRC engine to select from among more than one blocks that do not include a CRC error (0 syndrome), if any exist, effectively using the CRC engine for error detection and error correction.

Performing soft correction in parallel using two soft correction engines.

A more detailed description of one exemplary implementation now follows. For simplification and for discussion of this implementation, the following assumptions are made, which should not diminish the generality of the algorithm.

The number of soft bits N used in the soft error correction engine is N=5;

The number of solutions K per Golay is K=15;

The size of the CRC block is M Golay 12-bit words with M=16;

The size of the CRC block is M' data 16-bit words with M'=12;

The number of Golay word results with two possible decoding choices in any CRC block is D=5, hence $2^5=32$ possible CRC solutions.

A different error correction code may produce a different M to M' ratio. For instance, in an alternate (n, k) code in which a k-bit data word is encoded as n-bit transmitted symbols or words, the M to M' ratio may be determined by the CRC block size chosen, such that M is an integer multiple of the CRC length and M' is an integer multiple of k. In the present implementation, the CRC block size is M Golay 12-bit words where M=16, and the CRC block size is M' data 16-bit words where M'=k=12, so the M to M' ratio is 16/k. The n-bit length of the encoded transmitted symbol or word affects the design of the hardware in that n/k clocks are used to transmit each bit of useful data. Since the Golay code is a (24, 12) code, this implementation uses 32 clocks for each 16-bit data word in the CRC layer, which ratio conveniently allows five of the Golay words to have two possible decoding choices, each (D=5).

FIG. 1 shows an exemplary encoding and transmission process 100. Process 100 includes using a transmitter that generally prepares a sequence of M'−1 (i.e., 11) 16-bit words (step 110). This sequence may be concatenated into a serial word or polynomial (step 120), for which a CRC remainder is generated through division of the serial word by a 16-bit CRC polynomial (step 130), for example, polynomial, 1010 0000 0000 0001, which may be known as CRC16. By appending the CRC remainder to the 11 16-bit words accepted for transmission (step 140), CRC blocks having 12 16-bit words may be formed from the serial word and transmitted.

CRC blocks of this dimensionality may be realized as M (e.g., 16) 12-bit words (step 150). These 12-bit words are typically multiplied by an 1-bit Golay polynomial (G) to generate 23-bit data words (step 160) to which an extra parity bit may be added to generate augmented Golay data words having 24 bits (step 170). The Golay data bits may be modulated onto the transmission medium thereafter (step 180).

Figure 2:
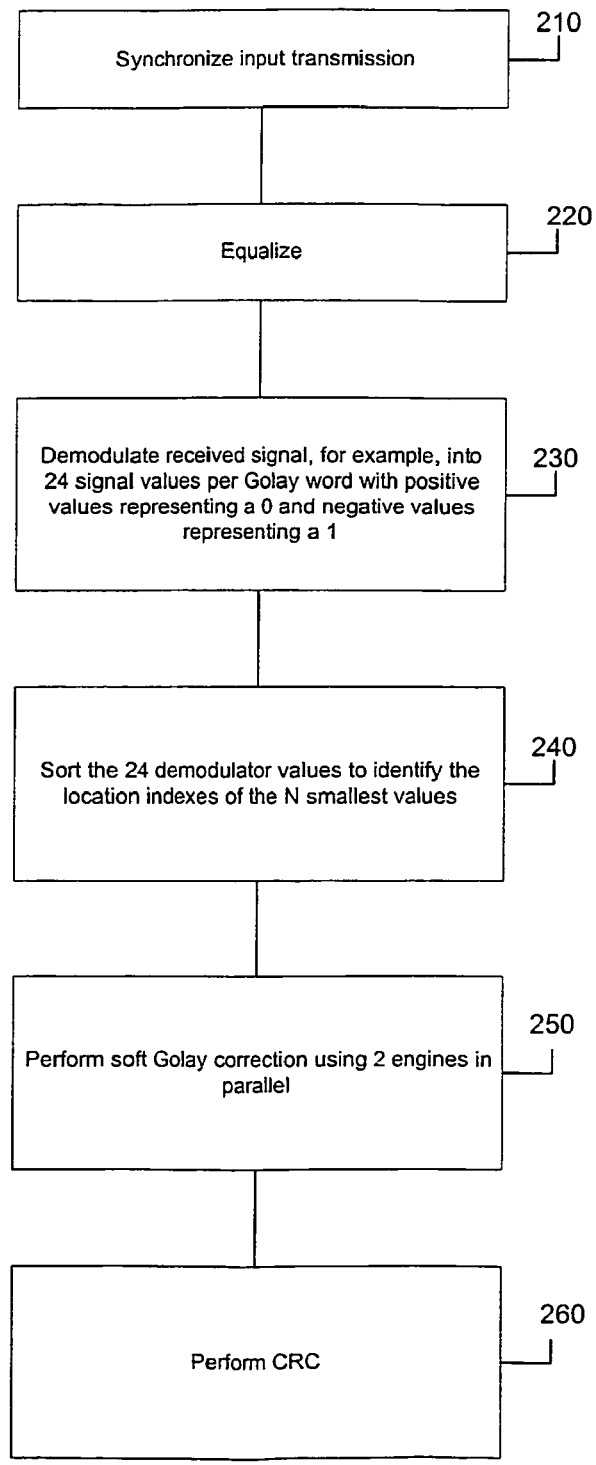
FIG. 2 is a flow chart of an exemplary receiving and decoding process.

FIG. 2 shows an exemplary receiving and decoding process 200, which generally reverses the transmitter process 100 of FIG. 1. Process 200 generally includes synchronizing (step 210) and equalizing (step 220) an input transmission signal that has been over-sampled. After synchronization (step 210) and equalization (step 220), the signal is demodulated (step 230) to produce a stream of bits and their relative strengths, for example, according to equation 1.

$$\text{Bit\_Weight} = \sum_{i=1 \ldots \text{Number\_samples\_per\_Bit}} \text{received\_Bit}[i] * \text{transmitted\_Bit}[i] \quad \text{Equation 1}$$

This is, for each received 24-bit Golay word, the 24 bits of the Golay word are sorted and the N (e.g., 5) lowest bit weight values are identified in an index list ("erasure list") using equation 1 above (step 240). Within the erasure list, these values are generally listed in an ascending order as erasure positions that identify the N weakest bits in a Golay word. Once sorted, the 24-bit words are passed to the Golay correction engine (step 250), which correction engine produces a result (e.g., one or more 12-bit words) that is passed to the second engine (e.g., a CRC engine) for further error detection and correction processing (step 260). Exemplary operations performed by the first and second engines (steps 250 and 260) are described in detail with respect to FIGS. 3-5.

Figure 3A:
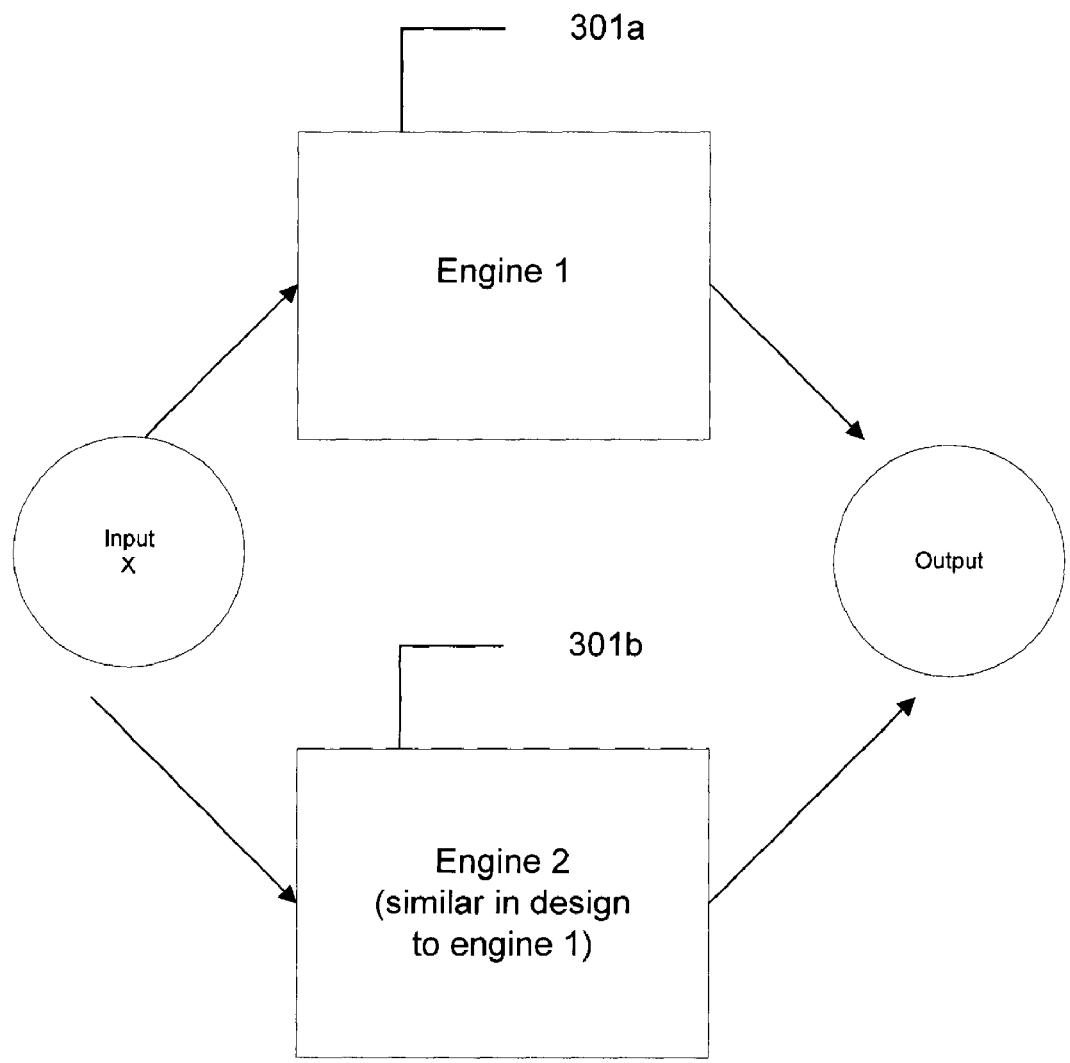
FIG. 3a is a block diagram of an exemplary hardware implementation including two Golay engines.

Referring to FIG. 3a, the Golay correction engine may include two or more engines of similar or divergent types (e.g., the two engines both may have the Meggitt decoder design, both may have some other similar design, or each may have a divergent design). These two engines may be configured to solve the correction equations serially (not shown) such that a pair of solutions are produced for each arriving 24-bit Golay word initially at the same rate. Alternatively, as shown for example by FIG. 3a, the two engines 301a and 301b may be configured in parallel such that they are capable of solving the correction in parallel using fewer clock cycles (e.g., one clock cycle), which may be significantly faster than the data is received (e.g., every 24 or 32 clock cycles). In any event, the result produced by each engine typically includes a 12-bit data word.

Figure 3B:
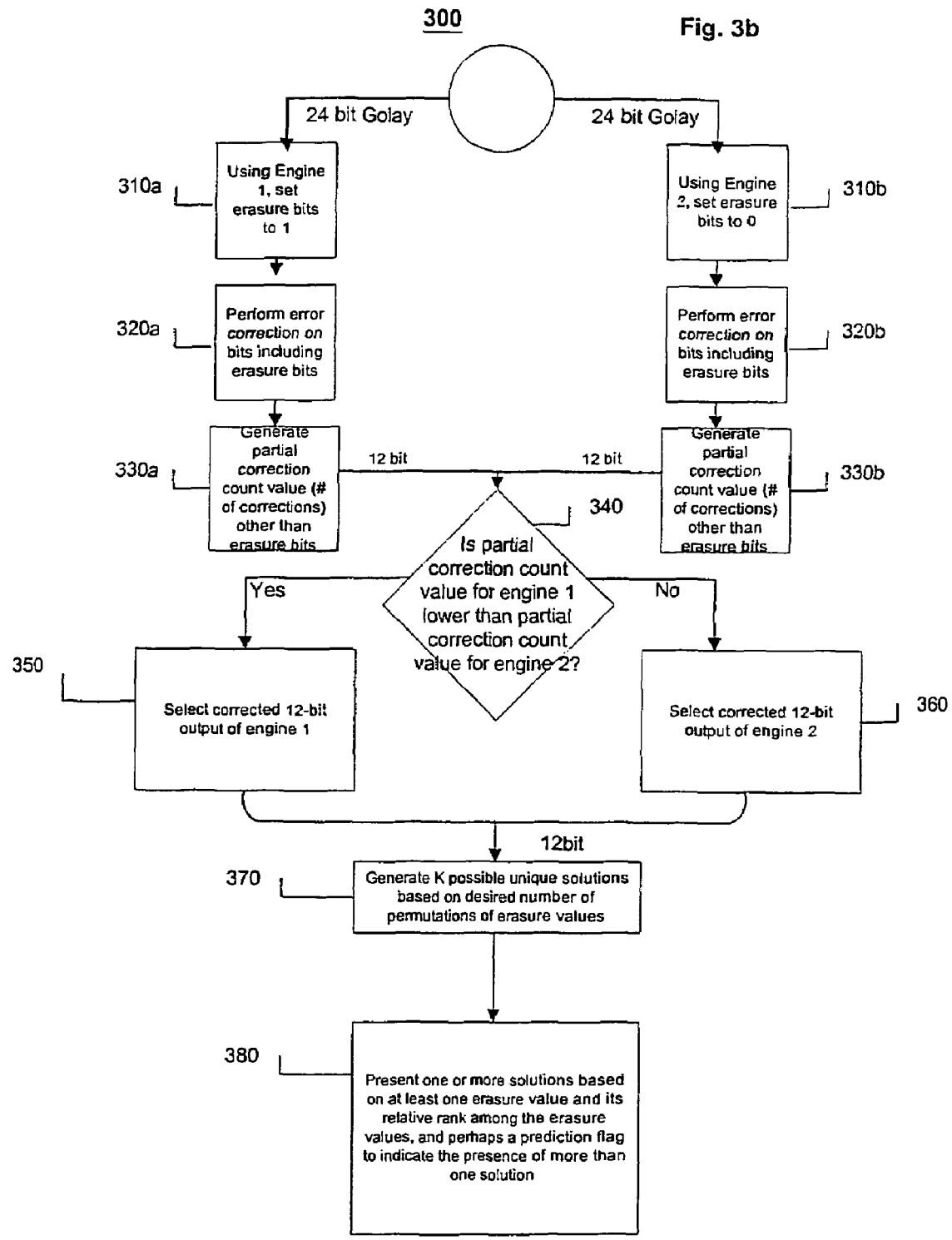
FIG. 3b is a flow chart of an exemplary Golay correction process that may be included in the decoding process of FIG. 2.

Referring to FIG. 3b, one implementation of soft Golay corrections 250 is described under an assumption that five soft bits are used by the Golay correction engine (i.e., N=5). In a first of two Golay engines operating in parallel, each of the five erasure bits may be set to 1 (step 310a), and in the other of the two Golay engines, each of the five erasure bits may be set to 0 (step 310b). Error correction is performed by both engines on bits including some or all of the erasure bits (steps 320a and 320b) and the number of corrections other than the erasure bits (e.g., a partial correction count value) may be generated for the outputs from each engine (steps 330a and 330b). Based on those outputs and the partial correction count values, the engine output having a lowest partial correction count value is identified (step 340) and selected (steps 350 and 360). For instance, if the partial correction count value is lower for the first Golay engine, then the corrected output of that Golay engine may be selected (step 350). Conversely, if the partial correction count value is lower for the second Golay engine, then the corrected output of that engine may be selected (step 360). Moreover, the data produced by or concerning the two engines includes a measure of how much correction each has performed in generating its result. The engine with the lowest partial correction count value generally has the strongest probability of producing the correct result so the corresponding 12-bit data result is saved. In this process, the partial correction count value does not typically take into account the corrections to the erasure bits, and the non-selected engine results typically are ignored.

The two engines generally produce one pair of results every clock cycle, where the results having a lower partial correction count value are preserved for further processing. Thereafter, during clock cycles prior to the receipt of a next pair of engine results (32 clock cycles in this example), several different permutations of erasure patterns may be identified based on different combinations of the erasure bits and tested. The number of permutations for testing (K) may be selectable, from one to the number of permutations possible given time and resource constraints (step 370). For illustrative purposes, fifteen permutations (K=15) are selected. Assuming fifteen permutations, during each of the first five clock cycles, only one of the erasure bits within the result may be tested generally starting with the very weakest erasure bit (e.g., the bit having the lowest correlation) and moving to the strongest of the erasure bits. For the following clock cycles, various combinations of erasure patterns may be tested. In this example, since fifteen (15) permutations are allowed, ten (10) additional erasure patterns including any of two, three, or four out of the five erasure bits may be chosen, again starting with the weakest combination and moving to stronger combinations, the more weak therefore being prioritized over the less weak.

In this example, after 15 clocks, as many as 15 unique solutions could be obtained (step 370). However, only a few solutions are usually unique and typically only one unique solution is produced over and over, particularly when the signal strength is fair, good, or very good. Nevertheless, the results in the solution set are ranked and a threshold number are saved in a buffer ("ranking box") capable of holding the desired number of unique results (e.g., 7), with the very first result typically being labeled as the preferred result since it was computed based on the perceived weakest single erasure bit (step 380). The capacity of the holding buffer may be selected by considering the size appropriate for handling a noisy signal situation, in which the number of solutions may be larger than one. However, for purposes of this description, the choice of seven (7) results is arbitrary.

The ranking box also may store the corresponding partial correction count value (or some related metric) as an "uncertainty" tag. If the ranking box is presented with a result that is already in the box, only one copy of the result is generally maintained with the lowest partial correction count value of the duplicates to indicate that this result might in fact be the correct result.

Ordinarily, the first result stored in the ranking box is presented as the default correct result to the CRC engine since it tends to correspond to a result based on the erasure bit having a lowest partial correction count value. However, any of the results stored in the buffer could be presented as the default correct result based on other appropriate criteria.

In addition, one or more alternative correction results may be presented with the default correction result. These alternative correction results typically are selected based on criteria suggesting that they are slightly less likely, equally likely, or more likely than the default correction result to be the correct result.

Figure 3C:
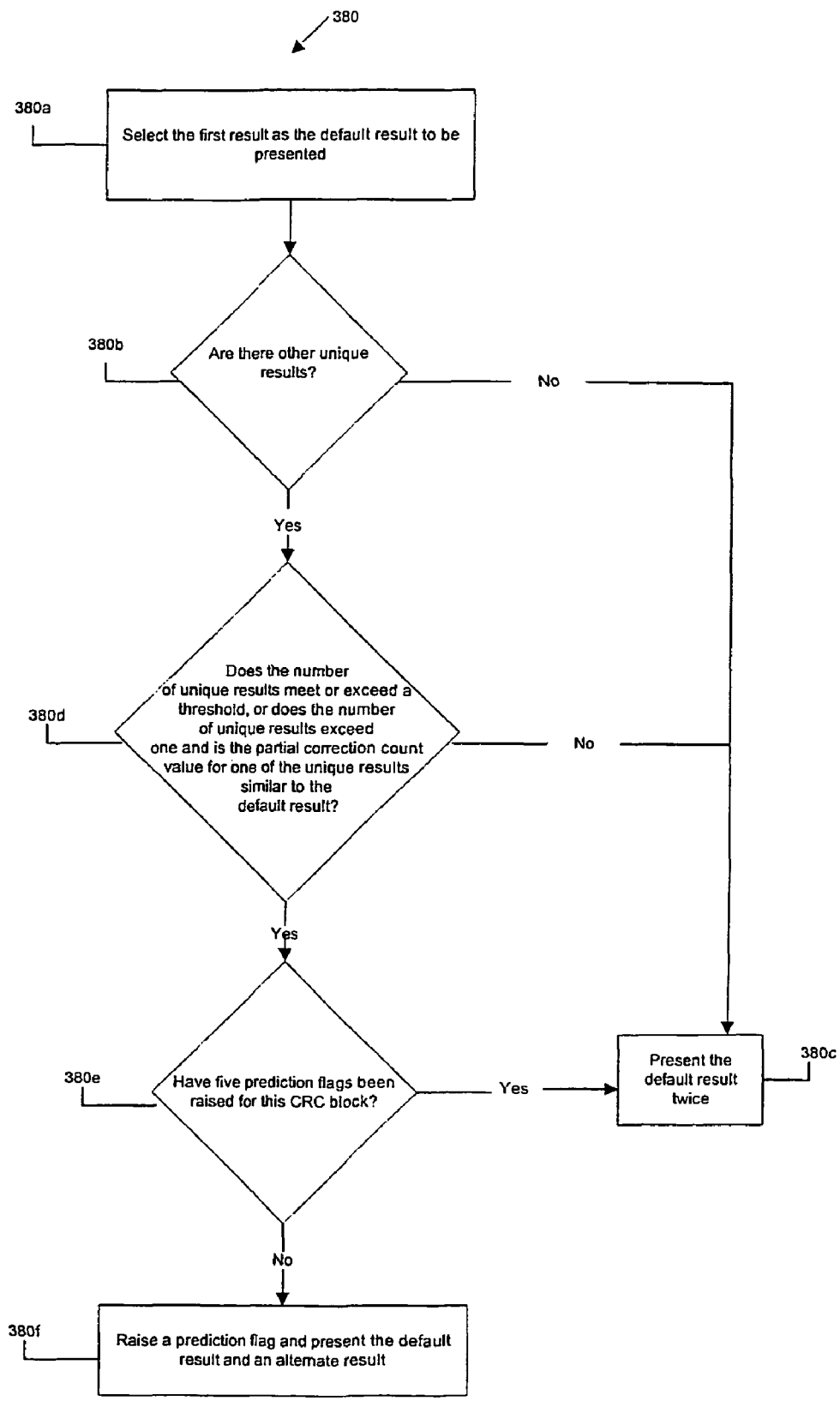
FIG. 3c is a flow chart of an expansion of the exemplary Golay correction process of FIG. 3b.

For instance, FIG. 3c illustrates one implementation of presenting one or more solutions (step 380). The first result may be selected as the default result to be presented (step 380a). If there are no other unique results (step 380b), then the default result may be presented more than once (e.g., twice) (step 380c). If there are other unique results (step 380b), then it may be determined whether the number of unique results meets or exceeds a threshold number of unique results (e.g., four) (step 380d). Alternatively, it may be determined whether the number of unique results exceed one and whether the partial correction count value for one of the unique results is similar to the partial correction count value of the default result (step 380d). If neither of the criteria is met (step 380d), then the default result may be presented more than once (e.g., twice) (step 380c). If at least one of the criteria is met (step 380d), then it is determined whether a threshold number of prediction flags have been raised (e.g., five) for this CRC block (step 380e). If, for example, five prediction flags have been raised for this CRC block, then the default result may be presented more than once (step 380c). If, for example, fewer than five prediction flags have been raised for this CRC block, then a prediction flag may be raised and an alternate result may be presented with the default result (step 380f).

A prediction flag may be presented along with one or more particular correction results to identify situations for which more than one correction result is presented corresponding to a single Golay word. The prediction flag may be concatenated with the correction results or may be made otherwise accessible to the CRC engine. For instance, the prediction flag may be concatenated with a particular Golay word, it may be concatenated with a block of Golay words, or it may be made accessible using a shared memory resource.

After this Golay error correction process 300, the M (e.g., 16) 12-bit data words typically are realized as default and/or alternate streams of M' (e.g., 12) 16-bit words, every four Golay 12-bit words producing three 16-bit words. It is also possible to concatenate default and alternate correction results into a single stream, to concatenate only selective (e.g., uncertain) correction results into the single stream, or produce $2^X$ separate streams.

In one implementation, e.g., where $2^X$ separate streams were presented by the first engine (e.g., Golay engine), each separate stream may be stored in a separate FIFO and received at $2^X$ CRC engines. For instance, the first engine may output 32 (i.e., $2^5$) separate streams that may be received at 32 CRC engines. The CRC engines may process each stream separately by dividing each received stream by the CRC polynomial used by the transmitter to produce a CRC remainder for each stream. Each CRC remainder then may be compared with the CRC remainder received with the original transmission to determine a CRC syndrome for each stream. The first stream where the CRC remainders match (i.e., the CRC syndrome=0), then that stream may be read from the appropriate FIFO as a correctly received stream. If none of the CRC remainders match, then the streams may be deemed to have been received incorrectly such that the transmitted stream needs to be repaired or re-fetched.

In one implementation, $2^X$ CRC engines may be realized by having one CRC engine that rotates through the data streams outputted by the Golay engine by performing a time-division operation on the incoming streams. In this instance, the first stream and the last stream outputted from the Golay engine may be stored in memory using, for instance, two memories. Following the CRC processing of the streams, the correctly received stream (i.e., the stream where the CRC syndrome=0), may be realized from the first stream in memory, the last stream in memory, or a combination of portions of the first and the last stream from the two memories.

Figure 4:
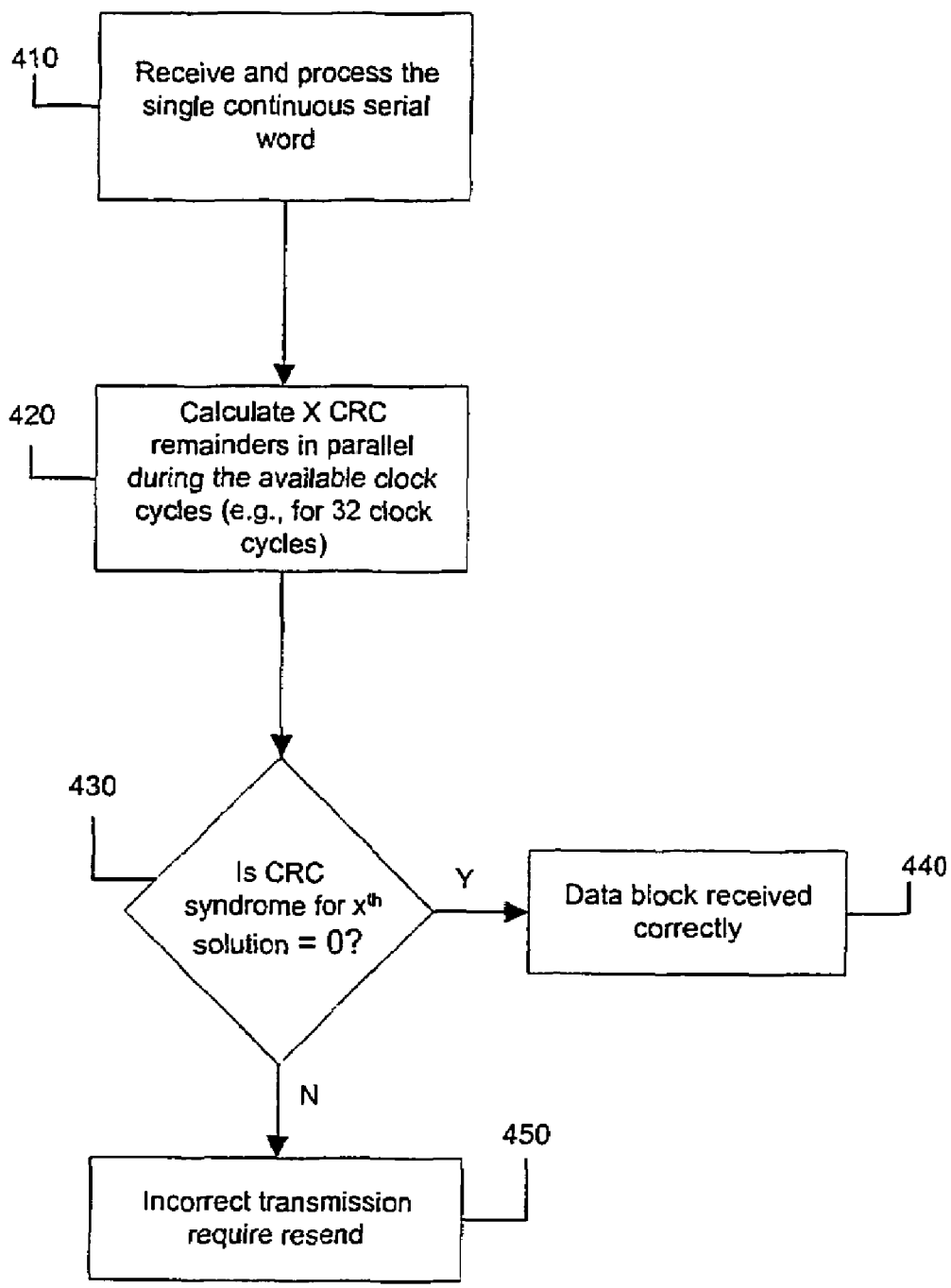
FIG. 4 is a flow chart of an exemplary Cyclic Redundancy Check (CRC) process that may be included in the decoding process of FIG. 2.

In another implementation, e.g., where one or more continuous streams are presented by the first engine, the CRC process 260 may be performed as shown by FIG. 4. The CRC process 260 may include receiving, for example, at one or more CRC engines, one or more streams of 16-bit words from the Golay engine as a single continuous serial block (step 410). A partial CRC remainder is generally calculated for each Golay word during one, some, or all of the 32 clock cycles generally required to receive that word in the example used for illustration purposes (step 420). The CRC polynomial used by the transmitter is used for this calculation. Once all of the Golay words within the serial block are received, the partial CRC remainders are used to generate a complete remainder that is compared against the CRC remainder received with the original transmission to determine a CRC syndrome. If the CRC remainders match, the CRC syndrome is 0 (step 430), and the CRC data is deemed authentic and accurate (step 440). However, if the CRC syndrome is not 0 (step 430), the block of data is deemed to have been received incorrectly such that the block needs to be repaired or re-fetched (step 450).

In general, a block of data may include any number of words. However, the longer the block, the fewer the number of required CRC remainders and hence the smaller the required bandwidth, processing load and expense in transmitting the data CRC syndrome. But, with increased block length comes an increased likelihood that the block may include an uncorrectable error and an increased block length for the required retransmission. In fact, if the blocks are too long and/or the channel is too noisy, then too many blocks may be corrupted that require retransmission, and thus, throughput may decrease. By contrast, if the blocks are relatively short, they may be received much more robustly, but the CRC payload may be more significant.

CRC hardware may be implemented by serial division with hardware quite similar to that used in serial error correcting hardware but with a different polynomial, with or without a correction capability. For instance, the CRC hardware may be implemented in parallel, similar to the Golay correction engine. For example, a single CRC engine or multiple CRC engines may receive, as input, two streams of output from the Golay engine and may process each stream in parallel (e.g., in one clock cycle). One implementation of a single CRC engine is described below with reference to FIGS. 5a and 5b.

Figure 5A:
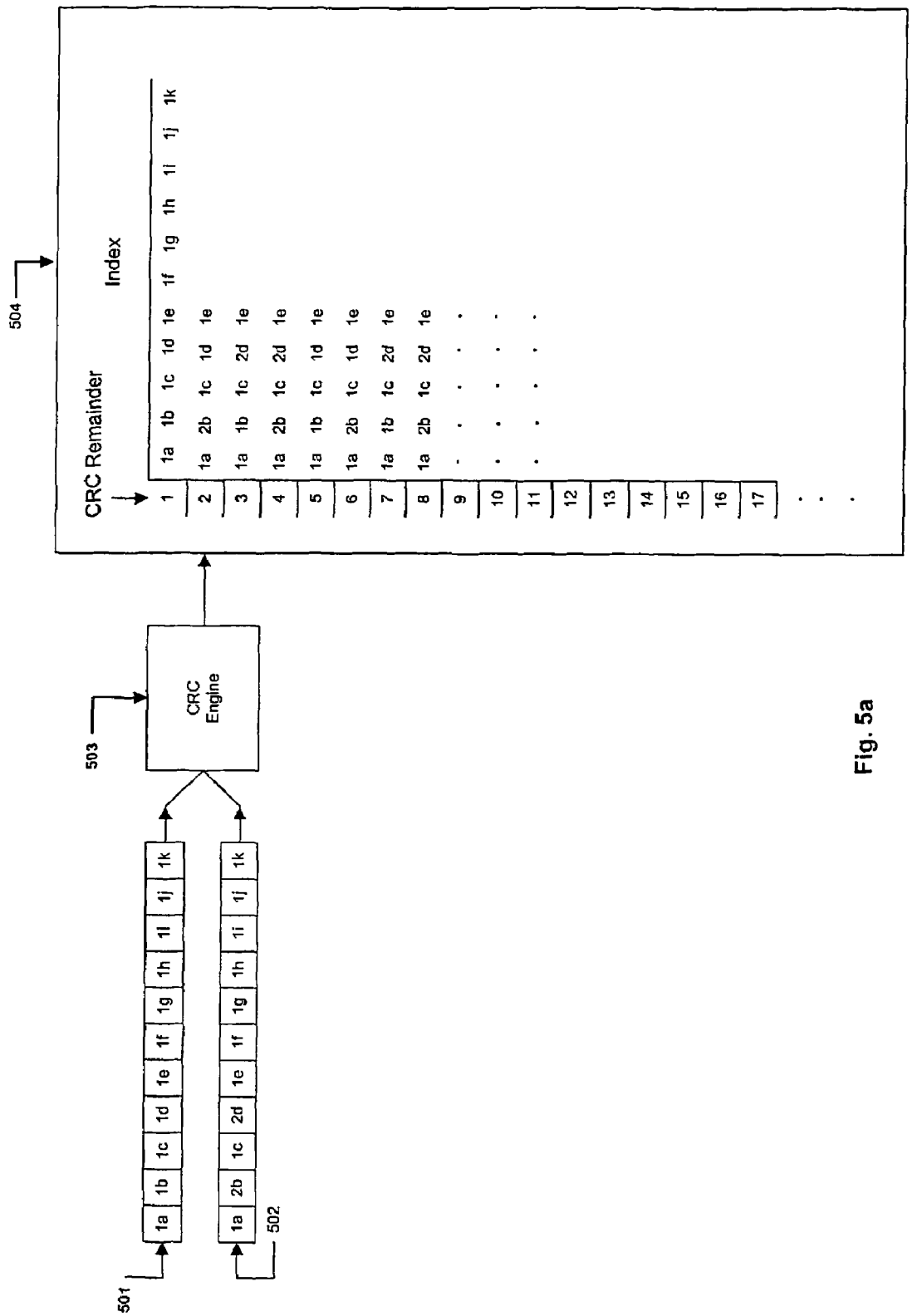
FIG. 5a is a block diagram describing operations that may be performed using the CRC process described by FIG. 4.

Referring to FIG. 5a, two streams of M' 16-bit words 501, 502 may be received by the CRC engine 503 from the Golay engine (not shown). The CRC engine 503 may include a single input at which the CRC engine 503 alternates between the two streams 501, 502, or more than one input. The streams 501, 502 may differ from one another by one or more of the 16-bit words. More specifically, for example, where X=5, the streams 501, 502 may differ from one another by up to five Golay words (which may correspond to an equal or greater number of 16-bit words if one or more of the Golay words span more than one 16-bit word). In one implementation, where X is increased, the streams 501, 502 may differ from one another by more than five Golay words, provided that the number of clock cycles between words is sufficiently increased to allow a number of computations necessary to account for the increased number of differing words between the two streams 501, 502.

In this implementation presented for illustration purposes, the CRC engine 503 receives a 16-bit word once every 32 clock cycles (the Golay code reduced 24 to 12 bits (or clocks)), and the CRC engine performs a partial 16-bit division in 1 clock cycle on the 16-bit word. Thus, after the CRC engine 503, it is generally available for processing for the next 31 clock cycles to calculate the partial division on the 16-bit word while it awaits the next 16-bit word. During this otherwise idle time, the CRC engine may be used to recompute the computation performed on the first received 16-bit word redundantly 31 additional times.

When streams 501 and 502 do not differ, or only one possibility for each word is selected from the two streams notwithstanding differences between them, the results produced by these redundant computations should be the same for all 32 clock cycles of each 16-bit word that is processed, and, therefore the 32 syndromes produced at the end of the 16-bit word block should be the same.

However, when streams 501 and 502 differ and those differences are processed by the CRC engine 503, one or more of the computation results will differ, identifying correct and incorrect settings for the bits corresponding to a predicator flag in the Golay error correction. For instance, in the following examples, streams 501 and 502 differ by two 16-bit words, in the positions of the streams identified by a first prediction flag and corresponding to the words labeled 1b and 2b and by a second prediction flag and corresponding to the words labeled 1d and 2d. For all other positions, the 16-bit words in each stream are the same.

The CRC engine 503 processes the first word (1a) in each stream, alternating between the first stream and the second stream for the CRC engine input, and should obtain the same partial CRC remainder 32 times, as illustrated by the first line of index 504 which contains a list of the CRC partial remainders that are built as the CRC engine 503 moves through words in the block. For example purposes, the resulting list includes the partial remainder for 1a a total of 32 times.

Next, the CRC engine 503 processes the second word 1b, 2b in each stream. The Golay engine may indicate the position of a word that includes both a default word and an alternate word through the use of the prediction flag. In this instance, the first prediction flag may be used to indicate that the second word in each stream 1b, 2b differ, perhaps because the Golay engine outputted default and alternate correction results for this particular word. When the CRC engine 503 processes the second word in each stream, it alternates between streams for the input, as it did with the first word. Thus, the CRC engine 503 computes a partial remainder for word 1a and includes that remainder to the index 504 under CRC remainder 1. The CRC engine then computes a partial remainder for word 1b and includes that remainder in the index 504 under CRC remainder 2. This process is repeated for the duration total of the 32 clock cycles. At this point, the index includes partial remainders for the first two words, which would have two different total remainders repeated 16 times. If the streams 501, 502 did not include any further prediction flags, the index would include two different remainders repeated 16 times each. For example, CRC remainder 1 would include the first remainder, CRC remainder 2 would include the second remainder, CRC remainder 3 would include the first remainder, CRC remainder 4 would include the second remainder, and so forth through CRC remainder 32.

In this illustration, however the streams differ by two words such that two prediction flags are included to indicate the two positions in the streams that diverge, one stream having a default word and the other having an alternate word. In this instance, the second prediction flag occurs at words 1$d$, 2$d$. As it is the second prediction flag encountered, and thus the second word for which two possibilities exist, there are four ($2^2$=4) potential variations among the two positions in question, and hence the block thus far. To address each of these possibilities, when the CRC engine 503 processes these two words, it adds their partial remainders to the index 504 in a manner that establishes a total of four (4) different combinations. For instance, as illustrated by FIG. 5a, it is possible to alternate between stream 501 and stream 502 by steps of two (2) corresponding to the rank of the predictor flag to accomplish these different combinations. In this manner, just like the first three (3) words, the particular word being processed is so processed sixteen (16) times, but each of the four (4) combinations appear only eight (8) times out of the 32 possible results.

Similarly, if a third prediction flag were set indicating the existence of a third word within the block for which alternative correction results exist, there would be eight ($2^3$=8) potential variations among the now three words in question, and hence the block thus far. To address each of these possibilities, when the CRC engine processes these two words, it adds their partial remainders to the index 504 in a manner that establishes all eight (8) different combinations. For instance, maintaining consistency with the example provided above for the second prediction flag and the illustration provided by FIG. 5a, it is possible to alternate between streams 501 and 502 by steps of four ($2^2$=4).

As the number of prediction flags continues to increase, so to will the number of words in question, the number of potential variations among the now-increased number of words in question, and, in the example provided above for up to three prediction flags, the step size when alternating between received streams 501 and 502. For instance, extrapolating from the above example, a relationship may be defined between the number of prediction flags for a block, the number of potential combinations in the words of that block, and the step size that may be used to iteratively derive the different combinations, as indicated in table 1 below:

TABLE 1

| Number of Flags (F) | Number of Potential Combinations ($2^F$) | Step Size ($2^{F-1}$) |
|---|---|---|
| 0 | $2^0$ = 1 (no variations) | 0 |
| 1 | $2^1$ = 2 | $2^0$ = 1 |
| 2 | $2^2$ = 4 | $2^1$ = 2 |
| 3 | $2^3$ = 8 | $2^2$ = 4 |
| 4 | $2^4$ = 16 | $2^3$ = 8 |
| 5 | $2^5$ = 32 | $2^4$ = 16 |
| . | . | . |
| . | . | . |
| . | . | . |
| X | $2^X$ | $2^{X-1}$ |

Figure 5B:
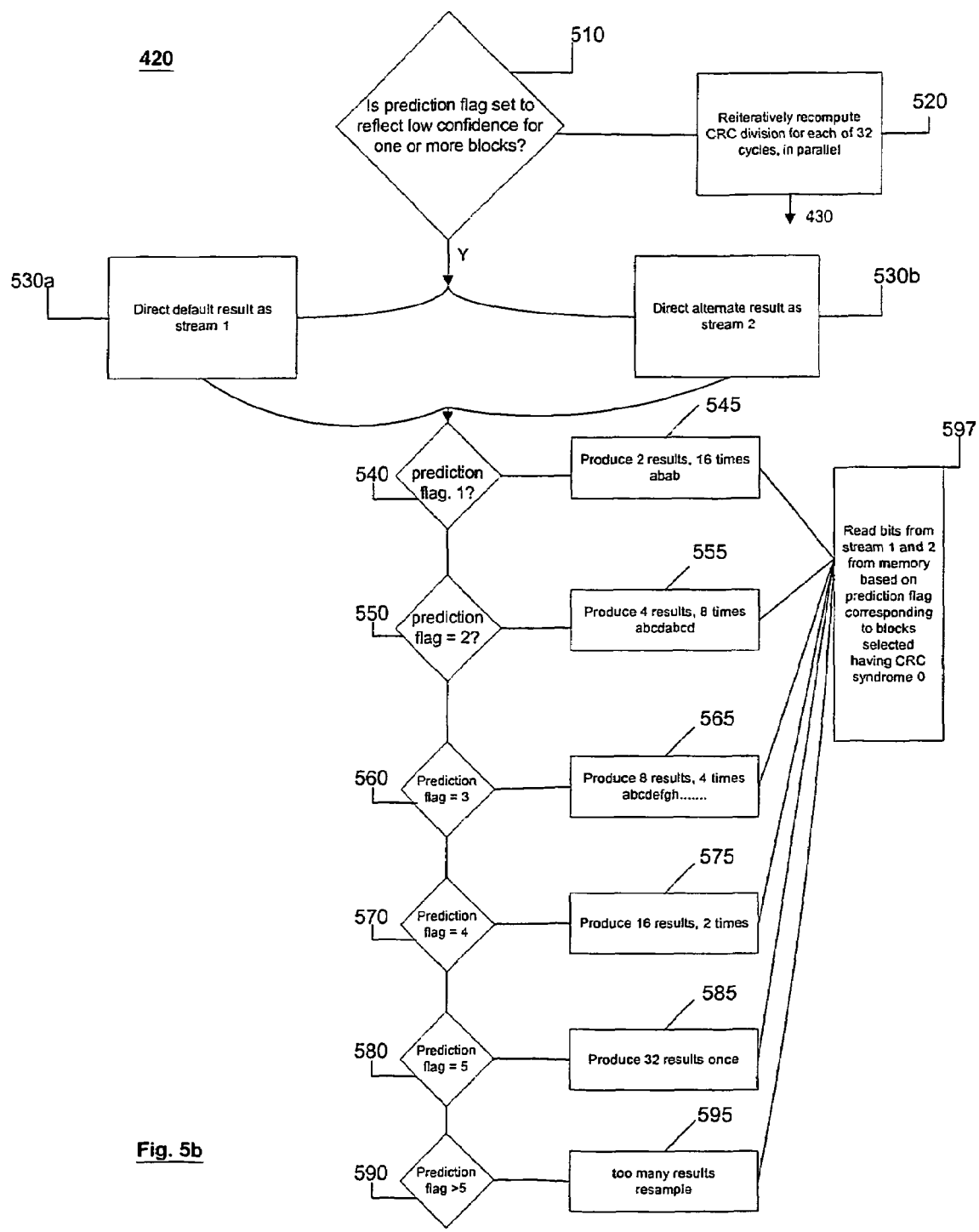
FIG. 5b is a flow chart of an expansion of the exemplary CRC process of FIG. 4.

FIG. 5b illustrates the flow of the operation of FIG. 5a in a flow chart. As described above with respect to step 410 of FIG. 4, the first error correction engine (e.g., the Golay engine) produces two streams received by the CRC engine input. Thereafter, process 420 of FIG. 5b includes determining whether the prediction flag is set to reflect low confidence for one or more words in the streams (step 510). For every block of data, several Golay results may be accepted as low confidence by observing the prediction flag described earlier. In one implementation, for example, where 32 clock cycles are required to communicate adjacent words in a data block, a maximum of 5 ($2^5$=32) Golay results may be accepted as low confidence by observing the prediction flag. When the error correction engine does not produce a prediction flag (step 510), it may output the default word in duplicate to two serial streams (step 520). When it outputs a prediction flag (step 510), it directs the default result (step 530a) and an alternate result (step 530b) to the two streams. Now, the CRC engine has 32 clock cycles to test the solutions by switching the input between the two sources. The steering logic follows the arrival of prediction flags.

If one prediction flag is placed over one Golay word in a block (step 540), then the two streams will be the same for all but one Golay word. But since the two streams differ by one word, the resulting CRC remainders will be different. In this example, the CRC engine will produce the two different results 16 times each for that word over the 32 clock cycles (step 545). The results may include the partial remainder and may be interleaved in the index, for example, 1$a$2$a$, 1$a$2$b$, 1$a$2$a$, 1$a$2$b$, . . . using the convention of FIG. 5a.

If two predictions flags are placed over two Golay words in a block (step 550), then the two streams will be the same for all but two Golay words. But since the two streams differ by two words in unrelated positions, the resulting CRC remainders will be different. In practice, over the 32 clock cycles, the CRC engine typically produces two different results 16 times each for that word, and four different combinations eight times each (step 555). The results may include the partial remainder and may be interleaved in the index, for example, 1$a$2$a$3$a$4$a$, 1$a$2$b$3$a$4$a$, 1$a$2$a$3$a$4$b$, 1$a$2$b$3$a$4$b$, 1$a$2$a$3$a$4$a$, 1$a$2$b$3$a$4$a$, 1$a$2$a$3$a$4$b$, 1$a$2$b$3$a$4$b$, . . . using the conventions of FIG. 5a.

If three prediction flags are placed over three Golay words in a block (step 560), then the two streams will be the same for all but three Golay words. But since the two streams differ by three words in unrelated positions, the resulting CRC remainders will be different. In practice, over the 32 clock cycles, the CRC engine typically produces two different results 16 times each for that word, and eight different combinations four times each (step 565). The results may include the partial remainder and may be interleaved in the index using the conventions of FIG. 5a.

If four prediction flags are placed over four Golay words in a block (step 570), then the two streams will be the same for all but four Golay words. But since the two streams differ by four words in unrelated positions, the resulting CRC remainders will be different. In practice, over the 32 clock cycles, the CRC engine typically produces two different results 16 times each for that word, and sixteen different combinations interleaved in the index using the conventions of FIG. 5a.

If five prediction flags are placed over five Golay words in a block (step 580), then the two streams will be the same for all but five Golay words. But since the two streams differ by five words in unrelated positions, the resulting CRC remainders will be different. In practice, over the 32 clock cycles, the CRC engine typically produces two different results 16 times each for that word, and thirty two different combinations once each (step 585).

Where words within a block are received with a separation of only 32 ($2^5$) clock cycles, a retransmission may be necessary (step 595) if there are greater than 5 prediction flags (step 590). In an alternative implementation, once the threshold number of prediction flags is encountered, then further prediction flags may be ignored and processing may proceed as if no other prediction flags exist.

The CRC engine may arrange the incoming streams to change based on which combination of predictions is encountered. At the beginning of a block, before a prediction flag is encountered, all partial remainders and therefore all 32 syndromes are the same. However, as each prediction flag is encountered by the CRC engine, the number of possible combinations increases by a factor of two. The state of the CRC engine receives words from within the block until a threshold limit of prediction flags is reached, X=5 in the preeminent example above. So long as the threshold limit is not exceeded, the CRC engine may synchronize all the timing to make it seem as if there were 32 separate serial CRC engines working in parallel.

Thus, in the example, the number of predictions may include five or fewer predictions. At the end of each CRC block, the indexed list of remainders may be compared to the CRC remainder value communicated with the transmitted signal to locate the first 0 syndrome. If a 0 syndrome is found, the position of the corresponding remainder on the index may be used to identify the data used to produce that remainder, and ultimately the syndrome, from the two streams saved in two memory locations (step 597). Moreover, when the final CRC index is complete, the positions of remainders within the index may be described using a 5-bit index value ($2^5$), and the data may be extracted from the memory locations in a manner corresponding to the 5-bit index. For example, if no 0 syndrome is found, then the block may reported as bad and retransmission may be necessary.

For instance, if the first CRC syndrome was 0, (index=0) then the data may be read directly from the default memory in order it was written since no predictions were needed, even if several were used.

If the second CRC syndrome is 0, the corresponding CRC index has a value of 1 (00001) such that the data may be read directly from the default memory in order it was written except for the one alternate word located in the 2nd memory at a position identified by the first prediction flag.

If the third CRC syndrome is 0, the corresponding CRC index has a value of 2 (00010) such that the data may be read directly from the default memory in order it was written except for the one alternate word located in the 2nd memory at a position identified by the second prediction flag.

If the fifth CRC syndrome is 0, the corresponding CRC index has a value of 4 (00100) such that the data may be read directly from the default memory in order it was written except for the one alternate word located in the second memory at a position identified by the third prediction flag.

If the ninth CRC syndrome is 0, the corresponding CRC index has a value of 8 (01000) such that the data may be read directly from the default memory in order it was written except for the one alternate word located in the second memory at a position identified by the fourth prediction flag.

If the seventeenth CRC syndrome is 0, the corresponding CRC index has a value of 16 (10000) such that the data may be read directly from the default memory in order it was written except for the one alternate word located in the second memory at a position indicated by the fifth prediction flag.

In the above five cases, one bit was needed to repair the data stream even though other bits may have been, in effect, albeit ineffective.

It is also possible for more than one bit to have to be used in combination, in which case the resulting CRC index value will yield more than one 1. For instance, if the thirty second CRC syndrome was 0, the corresponding CRC index has a value of 31 (11111) such that the data may be read directly from the default memory in order it was written except for the five alternate words located in the second memory at positions identified by the first, second, third, fourth, and fifth prediction flags. For an example having a maximum of five soft bits (N=5), this may be the most serious correction case and may occur if the data source from the signal repeatedly throws weak data into the Golay engines.

A more advanced version of the engine having the same basic design could be even more effective, by over-clocking the CRC engine 2, 4, 8, or $2^Y$ times. The number of permutations increases by the increased amount of over-sampling, allowing an additional one, two, three, or Y extra predictions per block.

As described above, an error correcting algorithm has been designed that uses an (n, k) error correcting block code, soft error correction and a CRC to produce a new flexible algorithm that has includes additional error correcting capabilities. The algorithm may be effective in the intended application, in part, because the CRC engine often chooses corrected data unavailable to the previous unaided design. This leads to much higher throughput in noisy channels.

As described above in one implementation, the results of the Golay correction process may include a default result and an alternate result as indicated, for example, by a prediction flag. In another implementation, it is possible for the results of the Golay correction process to include a default result and more than one alternate result. Consistently, it is possible for the CRC engine to analyze a default and more than alternate result.

The described systems, methods, and techniques may be implemented in digital electronic and/or analog circuitry, computer hardware, firmware, software, or in combinations of these elements. Apparatus embodying these techniques may include appropriate input and output devices, a computer processor, and a computer program product tangibly embodied in a machine-readable storage device for execution by a programmable processor. A process embodying these techniques may be performed by a programmable processor executing a program of instructions to perform desired functions by operating on input data and generating appropriate output. The techniques may be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as Erasable Programmable Read-Only Memory (EPROM), Electrically Erasable Programmable Read-Only Memory (EEPROM), and flash memory devices; magnetic disks such as internal hard disks and removable disks; magneto-optical disks; and Compact Disc Read-Only Memory (CD-ROM). Any of the foregoing may be supplemented by, or incorporated in, specially-designed ASICs (application-specific integrated circuits).

It will be understood that various modifications may be made without departing from the spirit and scope of the claims. For example, advantageous results still could be achieved if steps of the disclosed techniques were performed in a different order and/or if components in the disclosed systems were combined in a different manner and/or replaced or supplemented by other components. For example, the technologies described above may be applied to data transmitted over different transmission media, such as, for example, power lines, telephone lines, cable lines, digital subscriber lines (DSL), integrated services digital network (ISDN) lines, radio frequency (RF) media, and other transmission media. Accordingly, other implementations are within the scope of the following claims.

What is claimed is:

1. A method for performing soft error correction, the method comprising:
   receiving a word at a soft correction engine capable of operating in at least first and second correction modes that have different ratios of hard errors to soft errors, wherein a soft error relates to a faulty bit whose position is predictable and a hard error relates to a faulty bit whose position is not accurately predictable;
   identifying soft bit positions within the word; and
   generating, based on the identified soft bit positions, a number of possible results for the received word using combinations of the identified soft bit positions and the at least the first and second correction modes that have different ratios of hard errors to soft errors.

2. The method as in claim 1 wherein the possible results include default results and alternate results, the method further comprising selecting among at least one of the default results and alternate results within the possible results as possible correct solutions based on a metric representing a likelihood of correctness.

3. The method as in claim 2 wherein the metric includes a lowest partial correction count value.

4. The method as in claim 1 further comprising inputting at least one result from among the number of possible results into an error handling engine for error detection.

5. The method as in claim 4 wherein the error handling engine includes a cyclic redundancy check (CRC) engine.

6. The method as in claim 1 further comprising inputting a default result and an alternate result from among the possible results into an error handling engine for selection of a correct solution as between the default result and the alternate result.

7. The method as in claim 6 wherein the error handling engine includes a CRC engine.

8. The method as in claim 6 wherein inputting the default result and the alternate result includes inputting the default result and the alternate result that differs from the default result by one or more words into the error handling engine for selection of the correct solution as between the default result and the alternate result.

9. The method as in claim 1 wherein the soft correction engine includes a Golay engine.

10. The method as in claim 1 wherein receiving the word includes receiving the word at a first soft correction engine and further comprising:
    receiving the word at a second soft correction engine that is capable of operating in at least first and second correction modes that have different ratios of hard errors to soft errors and is structured and arranged to operate in parallel with the first soft correction engine;
    performing, in parallel, soft error correction on the received word at both the first soft correction engine and the second soft correction engine; and
    generating a number of possible results for the received word at both the first soft correction engine and the second soft correction engine.

11. The method as in claim 10 wherein the first soft correction engine and the second soft correction engine include a Golay engine.

12. A system for performing soft error correction, comprising:
    means for receiving a word at a soft correction engine capable of operating in at least first and second correction modes that have different ratios of hard errors to soft errors, wherein a soft error relates to a faulty bit whose position is predictable and a hard error relates to a faulty bit whose position is not accurately predictable;
    means for identifying soft bit positions within the word; and
    means for generating, based on the identified soft bit positions, a number of possible results for the received word using combinations of the identified soft bit positions and the at least the first and second correction modes that have different ratios of hard errors to soft errors.

13. The system of claim 12 wherein the possible results include default results and alternate results, further comprising means for selecting among at least one of the default results and alternate results within the possible results as possible correct solutions based on a metric representing a likelihood of correctness.

14. The system of claim 13 wherein the metric includes a lowest partial correction count value.

15. The system of claim 12 further comprising means for inputting at least one result from among the number of possible results into an error handling engine for error detection.

16. The system of claim 15 wherein the error handling engine includes a CRC engine.

17. The system of claim 12 further comprising means for inputting a default result and an alternate result from among the possible results into an error handling engine for selection of a correct solution as between the default result and the alternate result.

18. The system of claim 17 wherein the error handling engine includes a CRC engine.

19. The system of claim 17 wherein the means for inputting the default result and the alternate result includes means for inputting the default result and the alternate result that differs from the default result by one or more words into the error handling engine for selection of the correct solution as between the default result and the alternate result.

20. The system of claim 12 wherein the soft correction engine includes a Golay engine.

21. The system of claim 12 wherein the means for receiving the word includes means for receiving the word at a first soft correction engine and further-comprising:
    means for receiving the word at a second soft correction engine that is capable of operating in at least first and second correction modes that have different ratios of hard errors to soft errors and is structured and arranged to operate in parallel with the first soft correction engine;
    means for performing, in parallel, soft error correction on the received word at both the first soft correction engine and the second soft correction engine; and
    means for automatically generating a number of possible results for the received word at both the first soft correction engine and the second soft correction engine.

22. The system of claim 21 wherein the first soft correction engine and the second soft correction engine include a Golay engine.

* * * * *

UNITED STATES PATENT AND TRADEMARK OFFICE
CERTIFICATE OF CORRECTION

PATENT NO.         : 7,398,451 B2                                            Page 1 of 1
APPLICATION NO. : 10/486248
DATED              : July 8, 2008
INVENTOR(S)        : Michael B. Propp and John Jackson It is certified that error appears in the above-identified patent and that said Letters Patent is hereby corrected as shown below:

In claim 21, line 3 (col. 16, line 51), replace "further-comprising:" with
-- further comprising: --.

Signed and Sealed this

Sixteenth Day of September, 2008

JON W. DUDAS
*Director of the United States Patent and Trademark Office*